United States Patent [19]

Florio et al.

[11] Patent Number: 5,618,400
[45] Date of Patent: Apr. 8, 1997

[54] ELECTROPLATING PROCESS

[75] Inventors: Steven M. Florio, Hopkinton; Jeffrey P. Burress, Milford; Carl J. Colangelo, New Bedford; Edward C. Couble, Brockton; Mark J. Kapeckas, Worcester, all of Mass.

[73] Assignee: Shipley Company, L.L.C., Marlborough, Mass.

[21] Appl. No.: 531,171

[22] Filed: Sep. 19, 1995

[51] Int. Cl.$^6$ .......................... C25D 21/06; C25D 21/16; C25D 21/18; C23C 28/00

[52] U.S. Cl. ..................... 205/98; 205/101; 205/125; 205/164; 205/183

[58] Field of Search ........................... 205/98, 101, 125, 205/164, 166, 183

[56] References Cited

U.S. PATENT DOCUMENTS

| | | | |
|---|---|---|---|
| 2,872,391 | 2/1959 | Hauser et al. | 205/125 |
| 2,897,409 | 7/1959 | Gitto | 174/257 |
| 4,619,871 | 10/1986 | Takami | 428/607 |
| 4,897,164 | 1/1990 | Piano et al. | 205/125 |
| 5,106,537 | 4/1992 | Nelsen et al. | 252/502 |
| 5,389,270 | 2/1995 | Thorn et al. | 252/22 |

OTHER PUBLICATIONS

Klochov et al., "Characteristics of a Graphite Dispersion in a High–Speed Cavitational Colloidal Mill", Deposited Doc, VINITI 3485–76, 10 pp. ?/76.

*Primary Examiner*—Kathryn Gorgos
*Assistant Examiner*—Edna Wong
*Attorney, Agent, or Firm*—Robert L. Goldberg

[57] ABSTRACT

A process for electroplating a substrate by coating the substrate with a coating of conductive particles. The coating of conductive particles is applied to the substrate from an unstable aqueous dispersion essentially free of a dispersing agent using physical dispersion means to maintain the stability of the dispersion.

27 Claims, No Drawings

ELECTROPLATING PROCESS

BACKGROUND OF THE INVENTION

1. Introduction

This invention relates to a process for electroplating substrates. More particularly, this invention relates to a step of metallization by electroplating a surface having a carbonaceous coating thereover formed by contact of the surface with a dispersion of a carbonaceous material and drying the surface having adsorbed dispersion thereon to form a coating of said carbonaceous material. The process is especially useful for the fabrication of primmed circuit boards.

2. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin—noble catalytic metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a "direct plate process" whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Patent No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface. In addition, in practice, it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors that overcome the deficiencies in the processes of U.S. Pat. No. 3,099,608 and in U.K. Pat. No. 2,123,036 are disclosed in U.S. Pat. Nos. 4,895,739; 4,919, 768; 4,952,286; and 5,276,290, each incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in patterned plating processes.

The processes of the aforementioned patents provide a substantial improvement over the process of the U.K. Patent. However, it has also been found that treatment of an adsorbed catalytic metal on a substrate having both nonconductive portions and metallic portions, such as a printed circuit board substrate, with a sulfide solution results in a formation of a sulfide on metal surfaces in contact with the solution of the sulfide precursor solution. Therefore, if the process is used in the manufacture of printed circuit boards, both the catalytic metal and the copper cladding or conductors of the printed circuit board base material are converted to a tenaciously adherent sulfide. If the copper sulfide is not removed prior to electroplating, it may reduce the bond strength between the copper and a subsequently deposited metal over the copper.

An alternative method for direct electroplating of nonconductors is disclosed in U.S. Pat. No. 4,619,741, incorporated herein by reference. In accordance with the procedures of this patent, a nonconductive substrate is coated with a dispersion of carbon black and then dried. The coating is removed from surfaces where plating is undesired and the remaining portions of the substrate are plated using procedures similar to those described in the aforesaid references. There are several problems inherent in this procedure. For example, carbon black is a poor conductor of electricity and consequently, before forming the carbon black dispersion, in practice, it is believed that the carbon black particles must be treated with an organic ionomer or polymer to enhance conductivity. In addition, during processing, and prior to electroplating, the carbon black dispersion is only poorly adhered to the underlying substrate and has a tendency to flake off of the substrate prior to the plating step. This results in void formation during plating. In addition, because of the poor adherence to the substrate, subsequent to plating, there is a tendency for the metal deposit to separate from the substrate. This can lead to interconnect defects between a metallized hole and an innerlayer in multilayer printed circuit fabrication.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures set forth in these patents, a dispersion of carbon black or graphite is passed through the through-holes to form a coating of the dispersion on the hole-walls. The coating is dried to yield a conductive layer of the carbon black or graphite which is sufficiently conductive for electroplating in a conventional manner.

In the above process, because carbon and graphite particles comprising the dispersion are large, relative the size of particles comprising true colloidal dispersions, it is necessary to use combinations of dispersing agents in the dispersion to maintain the stability of the dispersion and prevent settling of the dispersed particles during use. The dispersing agents maintain the dispersion stable, but when a substrate to be plated is contacted with the dispersion containing one or more dispersing agents, the dispersing agents are believed to encapsulate the carbonaceous particles and form a thin coating over all surfaces. This coating is difficult to remove. Where the dispersing agent encapsulates the carbonaceous particles, conductivity between carbonaceous particles is reduced. Since conductivity is reduced, voids may form in a subsequently deposited metal plate. Where the dispersing agent coats all surfaces to be plated, it remains following metal deposition as an intermediate layer between the carbonaceous coating and a subsequently formed metal deposit. This results in a reduction in bond strength between the metal deposit and carbonaceous coating which can ultimately result in delamination of the metal coating during use of an article formed by the process.

SUMMARY OF THE INVENTION

The present invention is directed to an improved process for the direct electroplating of a substrate such as a printed circuit board substrate using a dispersion of carbon black or graphite particles, hereinafter referred to collectively as a carbonaceous coating or a carbonaceous dispersion. In accordance with the invention, a carbonaceous dispersion is provided having a dispersing agent content reduced by at least 50 percent from prior art compositions and preferably completely eliminated. The particles within the dispersion are dispersed by physical means during use of the dispersion such as by continuously recirculating the dispersion in a closed loop from a treatment tank for the dispersion to a point remote from the treatment tank where the dispersion is reformed and back into the treatment tank. In the preferred embodiment of the invention, the means used to redisperse the dispersions is a shear pump, also referred to by the art as a colloid mill, which redisperses the carbonaceous particles within the dispersion. By continuous recirculation of the dispersion as described, the dispersion, though inherently unstable, is sufficiently stable during use such that a uniform coating is formed over a substrate to be plated by immersion of the substrate in the dispersion and drying.

DESCRIPTION OF THE PREFERRED EMBODIMENTS

The subject invention is suitable for the manufacture of a variety of commercial articles where a metal deposit is desired over a surface of a nonconductor. However, the invention is especially useful for fabrication of printed circuit boards having copper cladding over at least one surface of a printed circuit board substrate. For this reason, the description that follows is directed primarily to printed circuit board manufacture.

In printed circuit board manufacture, the substrate commonly used is an epoxy substrate filled with glass fibers and copper clad on at least one of its surfaces, or an innerlayer clad with copper, as used for multilayer circuit fabrication. As is known in the art, the epoxy can be substituted or mixed with other resins for specific purposes.

In the manufacture of a double-sided printed circuit board using a carbonaceous dispersion, a first step comprises formation of through-holes by drilling or punching or any other method known to the art. Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etchant that removes glass fibers extending into the holes from the hole walls. This is followed by a solution that neutralizes acid residues. The hole walls are then treated to promote catalyst adsorption. Such treatment solutions are often referred to as conditioners and typically comprise an aqueous alkaline surfactant solution for cleaning soil and an amine to condition the hole wall. The material of choice for the step of conditioning is a polyelectrolyte. Polyelectrolytes are typically polymers having a plurality of charged groups along their chains where the charged groups carry a charge opposite from the charge of a dispersed particle to be adsorbed onto the substrate. Polyelectrolytes used in metal plating procedures are disclosed in numerous publications including U.K. Patent No. 1,338,491 and U.S. Pat. Nos. 4,478,883; 4,554,182; 4,701,350 and 4,969,979, each incorporated herein by reference. The step of treatment with the polyelectrolyte, by itself, is old in the art and does not constitute a part of the invention.

Following the pretreatment procedures described above, the next step in the conventional process comprises treating the substrate with a dispersion of carbonaceous particles. As aforesaid, the particles may be of carbon black (amorphous) or may be of graphite (crystalline), or a mixture of the two. The carbon may be present in the dispersion in an amount of from about 0.1 to about 20% by weight of the dispersion, and preferably in an amount of from about 0.5 to about 10% by weight of the dispersion. The carbon may have a mean particle size within a range of from about 0.05 to about 50 microns and typically is of a particle size within a range of from about 0.3 to 5.0 microns. From the perspective of performance, particles from the smaller end of the size range are preferred. Graphite particles of suitable size can be prepared by the wet grinding or milling of raw graphite having a particle size greater than 50 microns, to form a slurry of smaller particles. Graphite particles of suitable size can also be formed by graphitizing already-small carbon-containing particles.

If both carbon black and graphite are used, the carbon black may have a substantially smaller particle size than the graphite. The ratio of graphite to carbon black may vary from about 1:100 to about 100:1, and preferably from about 1:10 to about 10:1.

The carbon black useful herein can be substantially as described in U.S. Pat. No. 5,139,642 incorporated herein by reference. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as described in U.S. Pat. No. 5,139,642 and may be either synthetic or naturally occurring. Suitable commercial graphites and graphite dispersions contemplated to be useful herein include: ULTRAFINE GRAPHITE, sold by Showa Denko K.K., Tokyo, Japan; AQUADAG E, sold by Acheson Chemical Company; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics. Synthetic graphite is preferred. Synthetic graphite is formed by heat treating (graphitizing) a carbon source at temperatures exceeding 2400° C.

Another component of conventional carbonaceous dispersions used for the formation of conductive coatings in electroplating processes is a water soluble or dispersible binding agent to bind the carbon particles. The binding agent is believed to assist the dispersed carbon particles in adhering to the surface of the non-conductive (i.e., dielectric) substrate which is to be made conductive for electroplating. The binding agent may be present as from about 0% to about 15 % by weight, and preferably from about 0.2 to about 10% by weight.

The binding agent is preferably a natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates and anionic polymers). Monosaccharide binding agents include tetroses, pentoses, and hexoses. Polysaccharide (including disaccharide and higher saccharides) binding agents contemplated for use herein include sucrose, maltose, fructose, lactose, stachyose, maltopentose, dextrin, cellulose, corn starch, other starches, and polysaccharide gums. Polysaccharide gums include agar, arabic, xanthan, pectin, alginate, tragacanath, dextran and other gums. Derivative polysaccharides include cellulose acetates, cellulose nitrates, methylcellulose, and carboxymethylcellulose. Hemi-cellulose polysaccharides include d-gluco-d-marmans, d-galacto-d-gluco-d-mannans, and others. Anionic polymers include the alkylcelluloses or carboxyalkylcelluloses, their low- and medium-viscosity alkali metal salts (e.g. sodium carboxymethylcellulose, or "CMC"), cellulose ethers, and nitrocellulose.

The acrylics that may be used herein for use as binding agents include polymerizable monomers and polymers, for example, emulsion polymers commonly known as acrylic lattices. The monomers include acrylamide, acrylonitrile, acrylic acid, methacrylic acid, glycidyl methacrylate, and others. The acrylic polymers include polymers of any one or more of the foregoing monomers; polyacrylamide polymers; polyacrylic acid; acrylic ester polymers such as polymethyl acrylate, poly-ethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates.

Other binding agents may also be used such as vinyl resins including polyvinyl acetates, polyvinyl ethers, polyvinyl chlorides; pyrrolidone resins such as poly(N-vinyl-2-pyrrolidone); polyols such as polyvinyl alcohols and other materials that may be used as binding agents including polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols.

A practical upper limit to the amount of binding agent used is that amount which materially interferes with the conductivity of the resulting conductive coating by diluting the conductive solids in the composition after it is deposited as a film.

Another conventional component in a carbonaceous dispersion is an anionic dispersing agent. The anionic dispersing agent has a hydrophobic end and a hydrophilic end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus to disperse.

The amount of anionic dispersing agent used in the conventional system is an amount sufficient to cause the bound carbonaceous particles to disperse in the aqueous dispersing medium. The amount used is dependent upon the size of the carbonaceous particles and the amount of binding agent bound thereto. To determine the amount of dispersing agent that is required in any particular case, one of ordinary skill in the art begins by adding ever increasing amounts of dispersing agent to the bound carbonaceous particles until a sufficient amount is added to cause the particles to disperse. This amount of dispersing agent is the minimum effective amount of dispersing agent for the conventional systems utilizing the dispersing agent. Increasing amounts of dispersing agent may be added without adversely affecting the stability of the dispersion of the carbonaceous particles. To ensure that the particles remain dispersed, it has been recommended that a 10 percent excess of the dispersing agent be added. For example, the anionic dispersing agent is generally present in an amount of from about 0.1% to about 5% by weight.

Suitable anionic dispersing agents include acrylic lattices, aqueous solutions of alkali metal polyacrylates, and similar materials.

An optional component of the composition of the present invention is a surfactant used in combination with the dispersing agent. The function of the surfactant is to decrease the surface tension of the aqueous dispersing medium such that the aqueous dispersing medium containing the dispersed carbon particles is able to freely penetrate into the through holes. A second function of the surfactant is to wet the surfaces of the polymeric and glass substrates. This facilitates the coating of these surfaces with the carbon dispersion. The amount of surfactant that is used in any particular case will vary depending upon the surfactant itself. When used, the amount of the surfactant may vary from about 0.01% to about 10% by weight, and preferably in the amount of from about 0.02% to about 3% by weight.

Suitable surfactants for use in the present invention include TRITON X-100, sold by Rohm and Haas Co., Philadelphia, Pa.; FLUORAD®FC-120, FC-430, FC-431, FC-129, and FC-135 anionic fluorochemical surfactant; sold by Minnesota Mining & Manufacturing Co., St. Paul, Minn.; DARVAN NO. 1, sold by R.T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others.

The dispersion is used over a wide pH range such as from about 3.0 to 13.0, but preferably has a pH of from about 8 to 13.0 and more preferably, a pH within the range of 8.5 to 12. The pH may be maintained by a pH buffer. The buffer functions by precluding or minimizing changes in pH such as may occur during the course of a run as a large number of boards are treated with the composition of the present invention. The maintenance of a constant or nearly constant pH insures the composition is reproducible from board to board.

Another useful additive to the dispersion is a copper etchant or complexing agent compatible at the pH of the carbonaceous dispersion. This additive is used to etch copper cladding simultaneously with the formation of the carbonaceous coating. Copper etchants and complexing agents suitable for use within the useful pH range are known in the art and disclosed in numerous publications. A preferred class of materials are those materials used as complexing agents in electroless copper plating solutions. Such materials are disclosed in numerous prior publications including U.S. Pat. Nos. 3,728,137 and 3,790,392 incorporated herein by reference. Such materials include, by way of example, Rochelle salts, the sodium salts of ethylenediamine tetraacetic acid, nitrolotriacetic acid and its alkali metal salts, triethanolamine, modified ethylenediamine tetraacetic acids such as N-hydroxyethylene diamine triacetate, hydroxyalkyl substituted dialkaline triamines such as pentahydroxypropyldiethylenetriamine and the like. One preferred class of amines are the hydroxyalkyl substituted tertiary amines such as tetrahydroxypropylethylene diamine, pentahydroxypropyl diethylene triamine, trihydroxypropyl amine, trihydroxypropyl hydroxyethylethylene diamine and the like. Another suitable class of materials are those materials used as relatively mild copper etchants, especially the amine based etchants. Such etchants are known in the art and disclosed in numerous publications including U.S. Pat. Nos. 3,837,945 and 4,280,887, incorporated herein by reference. Such materials include, by way of example, ammonia and ammonium salts such as tetraamine cupric and cuprous salts and ammoniacal peroxy compounds as disclosed in the aforesaid patents. Aggressive etchants such as ferric chloride and chromic/sulfuric etchants are generally undesired for purposes of this invention. Preferably, the material used to add to the dispersant is one that is capable of complexing with the copper cladding to theoretically remove only the top monolayer of the copper cladding. However, for purposes of the invention, the dissolution agent is one that should be of a strength sufficient to etch from about 1 to 100 microinches of copper and preferably, from 5 to 25 microinches of copper during that period of time that the carbonaceous coating material is in contact with the copper. Obviously, in addition to the selection of the dissolution agent, the depth of penetration of the dissolution agent is controlled by pH and concentration. A preferred etchant is ammonium hydroxide as ammonium hydroxide provides adequate removal of copper ions from the surface of the cladding and may be used for close pH control.

The etchant is added to the dispersion in an amount sufficient to etch copper as described above. Preferably, the etchant is used in an amount of from about 0.1 to 10 percent by weight of the dispersion and more preferably, in an amount of from 0.5 to 5 percent by weight of the dispersion. The method of adding the amine is by simple mixing and does not constitute a part of this invention.

A final component of the composition is an aqueous dispersing medium. The phrase "aqueous dispersing medium," as used herein, includes any solvent that is from 80 to 100% water wherein the balance of the material is a water soluble organic composition. Typical water soluble organic compositions include the low molecular weight alcohols, such as methanol, ethanol, and isopropanol. Additional organic components include solvents such as dimethylsulfoxide, tetrahydrofuran, and ethylene or propylene glycol. Preferably, the aqueous dispersing medium is 100% water.

As described above, the anionic dispersing agents conventionally used to stabilize the carbonaceous dispersion encapsulates the particles interfering with both the conductivity of the resulting conductive coating and the bond between the conductive coating and a subsequently deposited metal plate. In accordance with the subject invention, the concentration of the anionic dispersing agent and surfactant is reduced from the level used in the prior art by at least 50 percent and more preferably, the surfactant is completely omitted from the dispersion.

With the reduction or elimination of the dispersing agent in accordance with the invention as discussed above, the dispersion is unstable and with time in storage or upon standing in a treatment tank, the dispersion will settle resulting in a significant particulate concentration gradient between the top and bottom of the treatment tank with the concentration of particles greatest at the bottom of the tank and lowest at the top of the tank. With this concentration gradient, when a substrate to be plated is passed through a treatment tank containing the dispersion in a vertical mode, the carbonaceous particles would tend to adsorb onto the substrate somewhat in proportion to the concentration gradient within the treatment tank—i.e, the coating would be thicker at the bottom of the substrate closest to the bottom of the tank and thinnest at the top of the substrate. This would result in an uneven metal deposit over the substrate.

In accordance with the invention, a carbonaceous dispersion is used, preferably free of dispersing agent, and physical means are used to continuously redisperse the particles and maintain the dispersion homogenous during treatment of a substrate. The preferred physical means in accordance with the invention is the use of a shear pump, also known in the art as a colloid mill, with a portion of the dispersion circulated from the treatment tank holding the dispersion, preferably from the top thereof, in a closed loop back to the treatment tank, preferably to the bottom thereof, by means of a shear pump capable of homogeneously dispersing the carbonaceous particles within the dispersion.

In use, the dispersion is fed form the treatment tank through the closed loop containing the shear pump under pressure. Within the shear pump, the dispersion comes into contact with a rapidly spinning rotor. The rotor is set very closely and precisely to a matching stationary stator which creates a gap between the rotor and the stator. The distance between the two, the gap, is adjusted to a distance of from 0.001 to 0.125 inches and preferably, about 0.020 inches. This space is referred to as the grinding gap. As the dispersion comes into contact with the rotor, it is flung to the edge thereof by centrifugal force. This forces pushes the dispersion down through the narrow grinding gap between the rotor and stator. Particles, while whirling around in the film on the rotor, are subjected to a many eddy currents of tremendous force. This force imparts high shear to the product which overcomes the surface forces tending to hold the particles together. The product passes through the shear zone and is forced out into an open area. At this point, it passes out of the shear pump through a suitable opening and back into the closed loop described above for return to the treatment tank. Dependent upon the actual shear pump used, it may be necessary to used a conventional centrifugal pump in conjunction with the shear pump to maintain adequate flow rate.

It is known that shear pumps or colloid mills have rotors varying between about 1 and 8 inches. The rotor may rotate at a speed of from about 1,200 to 10,000 RPM dependent on the size of the rotor and the flow rate through the mill, the higher RPM being used with the smaller rotors and lower flow rates. In the preferred embodiment of the invention, a 1 to 4 inch rotor is preferred and used at a speed of from 3,000 to 9,000 RPM.

When using the shear pump or mill, the dispersion must be circulated through the pump at an adequate flow rate to ensure that the dispersion remains homogeneous during the step of coating the dispersion onto a substrate. The flow rate may be referred to in units of tank volume per unit time. Thus, one tank volume per hour would be the full volume of the dispersion in the treatment tank circulated through the closed loop during a period of one hour. In accordance with the invention, the flow rate of the dispersion through the closed loop would be at least two tank volumes per hour, preferably from 4 to 25 tank volumes per hour and most preferably, from 6 to 12 tank volumes per hour.

The use of a shear pump as described above is the preferred embodiment of the invention as it provides a relatively homogenous dispersion that is stable for sufficient time without disturbing the dispersion within the treatment tank during the step of coating the dispersion on a substrate. Other methods may be used that are lesser preferred. For example, a conventional rotary pump may be used in place of the shear pump, but passing the dispersion through such a pump does not adequately disperse the particles within the dispersion nor provide a dispersion that is stable for a sufficiently long time. High speed agitators may be placed within the treatment tank to agitate the dispersion. However, the agitator disrupts the dispersion by forming air bubbles within the dispersion, by creating foam and also fails to adequately disperse the particles. Both air bubbles and foam may lead to the formation of voids and discontinuities in a metal deposit.

When using physical means to maintain the dispersion homogeneous, it is also advantageous to filter the dispersion to remove agglomerates. Therefore, a filter is preferably used in the closed loop through which the dispersion is passed downstream of the shear pump. The filter should have the ability to remove particles slightly larger than the mean particle with the dispersion. For graphite dispersions, a filter suitable of removing particles having a diameter greater than at least 200 microns and preferably greater than 50 microns is suitable.

With the exception of the physical means for dispersing the particles within the dispersion during use, the dispersion is used in conventional manner. Using a copper clad substrate having apertures therein for purposes of illustration, the board would be cleaned, rinsed, treated with a conditioner that is preferably a polyelectrolyte conditioner, and then treated with the dispersion. The dispersion would be maintained in a treatment tank and would be circulated through the shear pump during use. A coating of the dispersion would be formed on the substrate. Thereafter, the coating would be dried to remove the dispersing medium, and optionally fixed though this step does not appear to be critical for practice of the subject invention. The carbonaceous coating would then be removed from metallic copper surfaces which is facilitated if the dispersion contains an etchant by the step of simultaneously etching the copper with the dispersion during the formation of the particulate coating.

Following formation of the carbonaceous coating and removal of the same from copper surfaces, the part is ready for electroplating. The electroplating procedure is conventional. The part to be plated is used as a cathode in a conventional electroplating cell. Current density is conventional and varies typically within a range of from 10 through 40 amps/ft.$^2$. In practice, it is convenient to initiate the current as the part enters the plating solution. A preferred current density range is from 15 to 30 amps/ft.$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in primed circuit board manufacture.

EXAMPLE 1

A dispersion is prepared by providing a preformed graphite dispersion obtained from Acheson Chemical Company and identified as Aquadag E. This dispersion contains about 3.0 percent by weight particulate graphite having a mean particle size of about 1 micron. The pH of the dispersion is adjusted to 10.5 by addition of ammonium hydroxide which functions both as an etchant for copper and as a pH adjustor. The dispersion is free of a dispersing agent.

EXAMPLE 2

The following example illustrates the manner in which a printed circuit board substrate may be electroplated in accordance with the procedures of this invention. All proprietary chemicals identified in the example are available from Shipley Company, L.L.C. of Marlborough, Mass.

A multilayer circuit board having 4 circuit layers with an array of 14 and 36 mil. holes may be subjected to the following procedure.

Step 1 Pre-clean and condition:
 a. immerse in a proprietary organic solvent identified as MLB 211 at 160° F for 5 minutes and water rinse;
 b. desmear the hole walls with a proprietary permanganate solution identified as MLB 213 Promoter at a temperature of 180° F. for 6 minutes and water rinse;
 c. neutralize acid residues by treatment with a proprietary alkaline solution identified as Neutralizer 218-1 at room temperature for 3 minutes and water rinse;
 d. condition the hole walls using a proprietary quaternary amine polyelectrolyte solution identified as XP-9503 at a temperature of 105° F. for 5 minutes and water rinse.

Step 2 Form conductive particle coating:
 a. provide a treatment tank having a capacity of 135 liters filled with the dispersion of Example 1, a CPVC loop with a feed from the bottom of the tank and a return to the top of the tank and containing a shear mill identified as a Premier Colloid Mill pump having a 2" Invar rotor and a stainless steel stator with a silicon carbide insert spaced 0.020 inches from the rotor, and a filter assembly having a 200 micron filter downstream from the shear pump;
 b. activate the shear pump and adjust the flow rate to 10 tank volumes per hour and pass the substrates through the dispersion within the treatment tank over a dwell time of 5 minutes at room temperature;
 c. dry the coating on the substrate by placing the substrate in an air circulating oven maintained at 75° C. for 30 minutes.

Step 3 Microetch copper surfaces and remove dispersion coating from copper cladding.
 Spray the board with water at a pressure of about 30 lbs./in$^2$ for 1 minute. Inspection of the copper cladding will reveal that the dispersion coating has been removed from the surface leaving a clean copper surface available for metal plating.

Step 4 Electroplate:
 Electroplate copper from an acid copper electroplating bath identified as ELECTROPOSIT® 1100 acid copper at a current density of 20 amps./ft.$^2$ and at a temperature of 70° F. for 1 hour and water rinse to obtain a deposit having a thickness of about 1.5 mils.

We claim:

1. A process for depositing metal on a substrate having metallic and non-metallic regions, said process comprising the steps of providing a dispersion of carbonaceous particles in an aqueous medium, said dispersion having a concentration of dispersing agent not exceeding 50% of that required to form a stable dispersion, providing a treatment tank containing said dispersion, contacting said substrate with said dispersion in said treatment tank while simultaneously physically dispersing the carbonaceous particles in said aqueous medium to form a uniform dispersion and a uniform coating of said dispersion over surfaces of said substrate, at least, partially drying, the coating of the carbonaceous particles, removing the carbonaceous coating from the metallic regions of the substrate and electroplating metal on said substrate from an electrolytic metal plating solution.

2. The process of claim 1 where the dispersion is essentially free of a dispersing agent.

3. The process of claim 1 where the carbonaceous particles are dispersed in the aqueous medium at a point external to the treatment tank simultaneously with the step of coating the substrates with the dispersion.

4. The process of claim 1 where the carbonaceous particles are physically dispersed in the aqueous medium by passage of a portion of the dispersion from the treatment tank, through a closed loop having pumping means therein, and back into the treatment tank.

5. The process of claim 4 where the physical means of dispersing the carbonaceous particles in the aqueous medium comprises passage of the dispersion through a shear pump.

6. The process of claim 5 where the carbonaceous particles are selected from the group consisting of carbon black and graphite.

7. The process of claim 6 where the carbonaceous particles are carbon black.

8. The process of claim 6 where the carbonaceous particles are in the form of graphite.

9. The process of claim 5 where the shear pump has a rotor varying in diameter from 1 to 8 inches separated from a stator by a gap.

10. The process of claim 9 where the gap between the rotor and stator varies between about 0.001 and 0.125 inches.

11. The process of claim 9 where the rotor rotates at between 800 and 8,000 revolutions per minute.

12. The process of claim 11 where the no-load rotation speed of the rotor is between 1,200 and 10,000 revolutions per minute.

13. The process of claim 9 where the flow rate through the closed loop varies between 4 and 25 tank volumes per hour.

14. The process of claim 13 where the flow rate varies between 8 and 12 tank volumes per hour.

15. The process of claim 1 where the metallic regions of the substrate are copper.

16. The process of claim 1 where the carbonaceous coating is removed from metallic regions by contact with a pressurized water spray.

17. The process of claim 16 where the step of contact with a pressurized spray is preceded by treatment of the copper with a microetch.

18. A process for depositing metal on a substrate having metallic and non-metallic regions, said process comprising the steps of providing an unstable dispersion of graphite particles in an aqueous medium, providing a treatment tank containing said dispersion, contacting said substrate with said dispersion in said treatment tank to form a coating thereon while simultaneously physically dispersing the graphite particles in said aqueous medium at a point external to the treatment tank by passage of a portion of the dispersion from the treatment tank, through a closed loop, through a shear pump within said loop, back into said treatment tank, at least partially drying the coating of graphite particles, removing the graphite coating from the metallic regions of the substrate and electroplating metal onto said substrate from an electrolytic metal plating solution.

19. The process of claim 18 where the shear pump has a rotor varying in diameter from 1 to 8 inches and a space between the rotor and stator of the shear pump varying between about 0.001 and 0.125 inches.

20. The process of claim 19 where the rotor rotates at a rate of between 1,200 and 10,000 revolutions per minute.

21. The process of claim 19 where the shear pump has a rotor varying in diameter from 1 to 8 inches separated from a stator by a gap.

22. The process of claim 19 where the flow rate through the closed loop varies between 4 and 25 tank volumes per hour.

23. The process of claim 22 where the flow rate varies between 8 and 12 tank volumes per hour.

24. The process of claim 19 where the metallic regions of the substrate are copper.

25. The process of claim 19 where the carbonaceous coating is removed from metallic regions by contact with a pressurized water spray.

26. The process of claim 25 where the step of contact with a pressurized spray is preceded by treatment of the copper with a microetch.

27. The process of claim 18 where the dispersion is essentially free of a dispersing agent.

* * * * *